United States Patent
Yuasa et al.

(10) Patent No.: US 9,618,411 B2
(45) Date of Patent: Apr. 11, 2017

(54) PRESSURE SENSOR DEVICE

(71) Applicant: Kabushiki Kaisha Toshiba, Tokyo (JP)

(72) Inventors: Hiromi Yuasa, Kanagawa-ken (JP); Hideaki Fukuzawa, Kanagawa-ken (JP); Yoshihiko Fuji, Kanagawa-ken (JP); Michiko Hara, Kanagawa-ken (JP); Yoshihiro Higashi, Kanagawa-ken (JP); Tomohiko Nagata, Kanagawa-ken (JP); Akio Hori, Kanagawa-ken (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 221 days.

(21) Appl. No.: 13/749,404

(22) Filed: Jan. 24, 2013

(65) Prior Publication Data

US 2014/0069200 A1 Mar. 13, 2014

(30) Foreign Application Priority Data

Sep. 10, 2012 (JP) ................................ 2012-198996

(51) Int. Cl.
 *G01L 9/16* (2006.01)
 *G01L 9/00* (2006.01)
 (Continued)

(52) U.S. Cl.
 CPC ............ *G01L 9/0051* (2013.01); *G01L 1/125* (2013.01); *G01L 9/16* (2013.01); *H01L 41/125* (2013.01)

(58) Field of Classification Search
 CPC ....................................................... G01L 9/16
 See application file for complete search history.

(56) References Cited

U.S. PATENT DOCUMENTS

| | | | |
|---|---|---|---|
| 2006/0251928 A1* | 11/2006 | Quandt | G01L 9/007 428/811.2 |
| 2006/0262457 A1* | 11/2006 | Hirata | B82Y 10/00 360/319 |

(Continued)

FOREIGN PATENT DOCUMENTS

| | | | |
|---|---|---|---|
| JP | 2003-37312 A | | 2/2003 |
| JP | 2003037312 A | * | 2/2003 |

(Continued)

OTHER PUBLICATIONS

Yang et al., A micron-sized GMR sensor with a CoCrPt hard bias, Feb. 2010, Journal of Semiconductors vol. 31, No. 2, 024005-1 to 024005-4.*

(Continued)

*Primary Examiner* — Robert Huber
*Assistant Examiner* — Herbert K Roberts
(74) *Attorney, Agent, or Firm* — Oblon, McClelland, Maier & Neustadt, L.L.P.

(57) ABSTRACT

A pressure sensor device comprises a support substrate including a thin film area which is bendable by a pressure, a sensor film comprising a first electrode provided on the thin film area, a second electrode provided on the first electrode, a reference layer provided between the first electrode and the second electrode, a free layer provided between the reference layer and the first electrode or between the reference layer and the second electrode, a spacer layer provided between the reference layer and the free layer, a shield provided on a side of the support substrate.

18 Claims, 19 Drawing Sheets

(51) Int. Cl.
*G01L 1/12* (2006.01)
*H01L 41/12* (2006.01)

(56) References Cited

U.S. PATENT DOCUMENTS

| | | | |
|---|---|---|---|
| 2008/0253037 A1* | 10/2008 | Kagami | B82Y 25/00 360/324 |
| 2010/0102403 A1* | 4/2010 | Celik-Butler | G01L 9/0042 257/415 |
| 2011/0295128 A1 | 12/2011 | Yuasa et al. | |
| 2012/0079887 A1 | 4/2012 | Giddings et al. | |

FOREIGN PATENT DOCUMENTS

| | | |
|---|---|---|
| JP | 2011-244938 | 12/2011 |
| JP | 2012-78186 A | 4/2012 |

OTHER PUBLICATIONS

Yang, Zheng, et al. "A micron-sized GMR sensor with a CoCrPt hard bias." Journal of Semiconductors 31.2 (2010): 024005.*
Office Action issued Sep. 19, 2014 in Japanese Patent Application No. 2012-198996 with partial English language translation.

* cited by examiner

MAGNETIZATION OF A SENSOR FILM FLUCTUATES

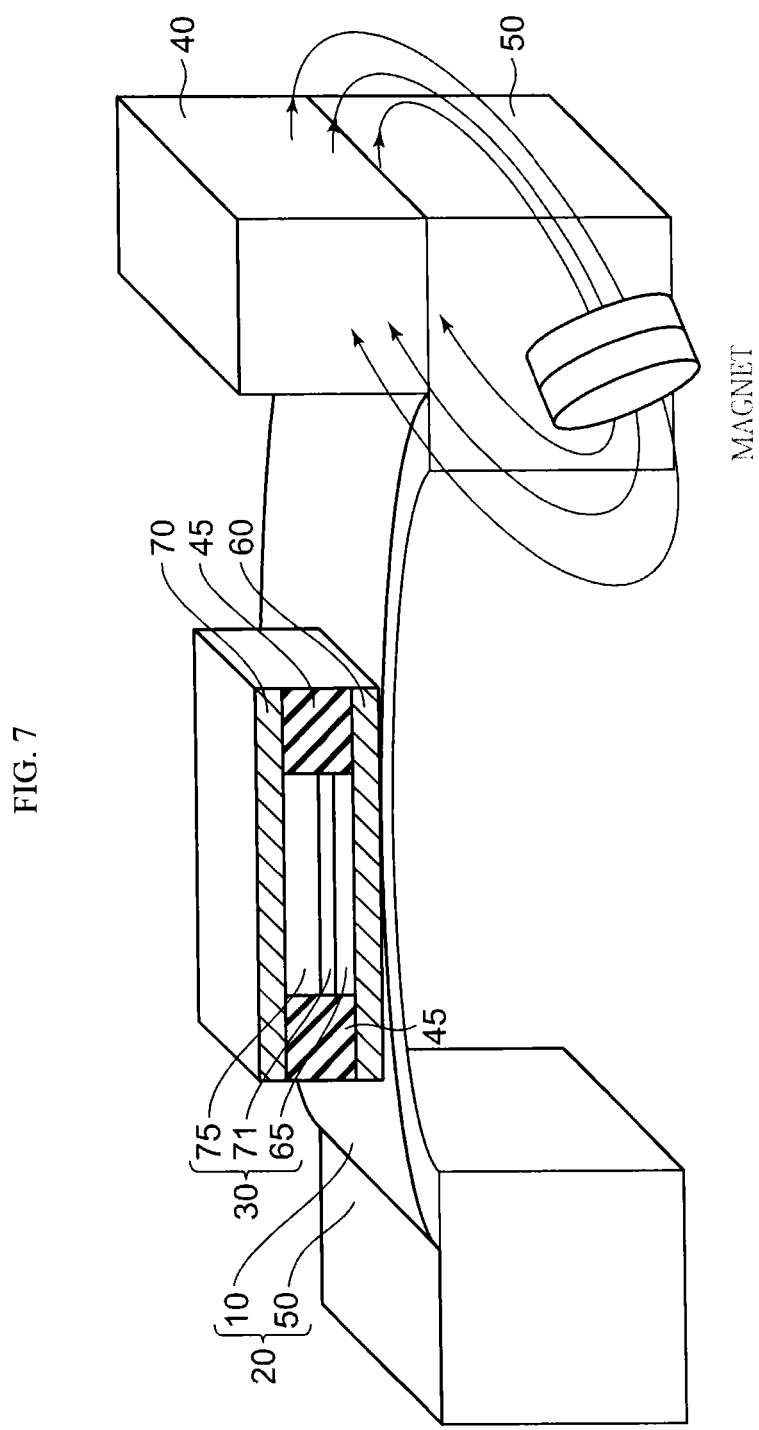

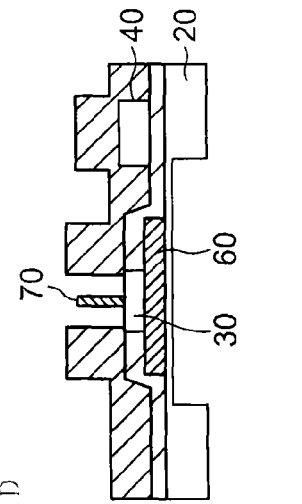
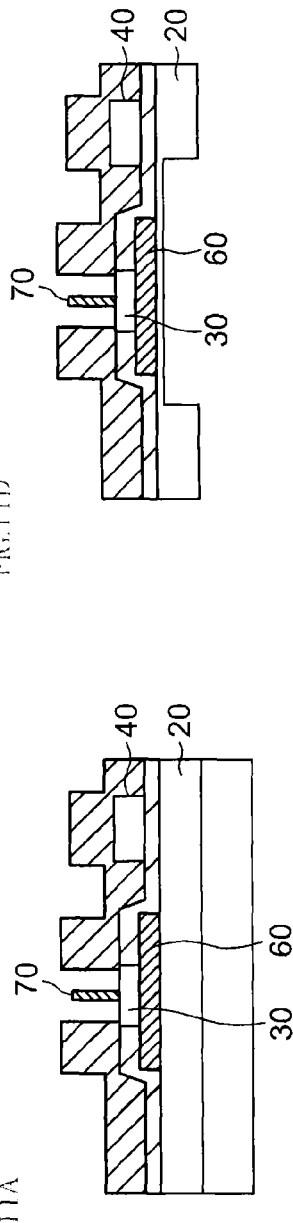
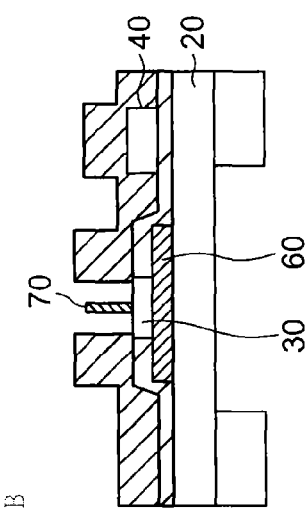
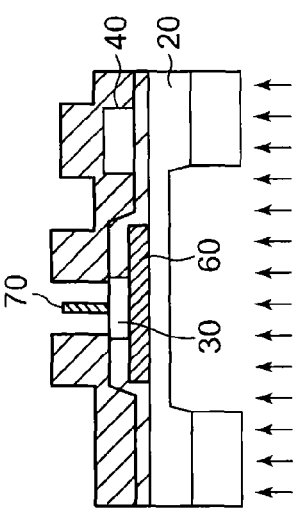

PRESSURE SENSOR DEVICE

CROSS REFERENCE TO RELATED APPLICATION

This application is based upon and claims the benefit of priority from Japanese Patent Application No. 2012-198996, filed on Sep. 10, 2012, the entire contents of which are incorporated herein by reference.

FIELD

Embodiments described herein relate to a pressure sensor device and a method of manufacturing the pressure sensor device.

BACKGROUND

A limit on the detection sensitivity of a pressure sensor device using Si-MEMS (Micro Electro Mechanical System) is determined by material values of Si. For improving the sensitivity of the pressure sensor device, it is necessary to enlarge the size of the pressure sensor device. However, pressure sensors are being more prominently used, for example, for constantly detecting blood pressure and within microphones such as those in mobile phones. For this reason, the demand for making compact and supersensitive pressure sensor devices has been increasing.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not to limit the scope of the invention.

FIG. 7 is a view showing a modified example of a pressure sensor device.

FIG. 11A is a view showing a modified example of a pressure sensor device.

FIG. 11B is a view showing a modified example of a pressure sensor device.

FIG. 11C is a view showing a modified example of a pressure sensor device.

FIG. 11D is a view showing a modified example of a pressure sensor device.

DETAILED DESCRIPTION

Figure 1:
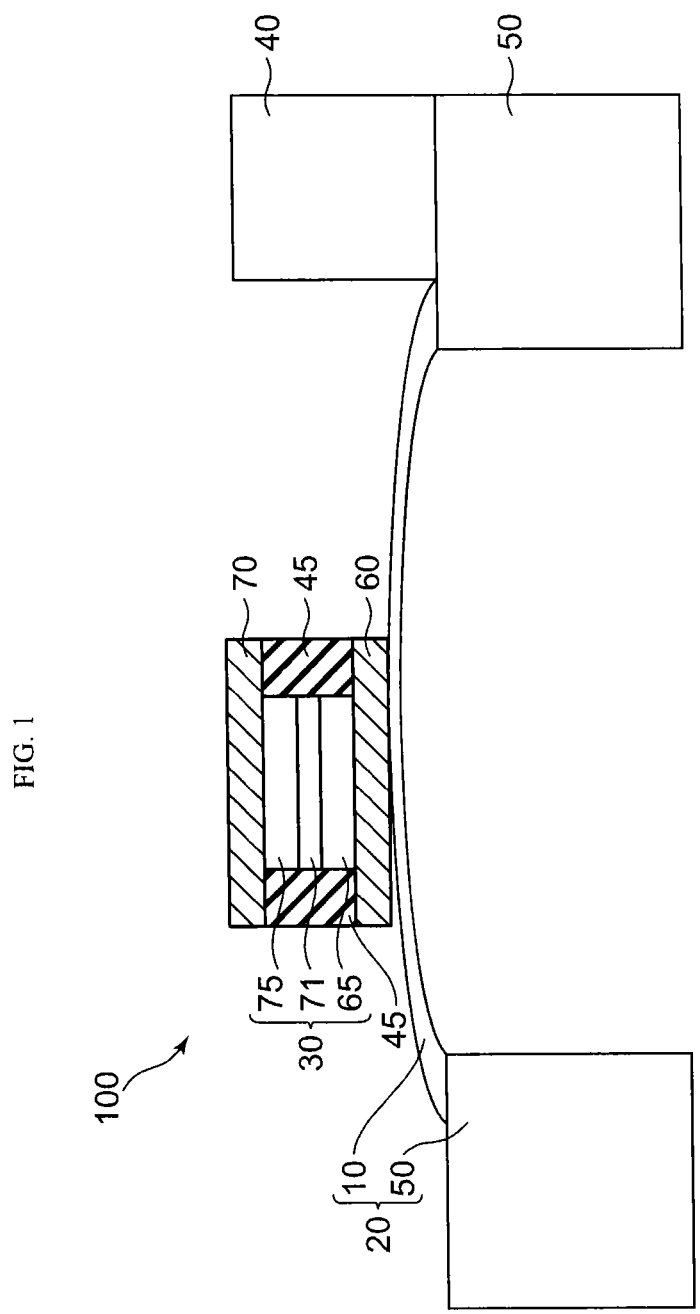
FIG. 1 is a view showing a pressure sensor device of an embodiment.

Embodiments will be described below with reference to the drawings. Wherever possible, the same reference numerals or marks will be used to denote the same or like portions throughout the drawings, and redundant explanations are omitted for similar embodiments.

Figure 2:
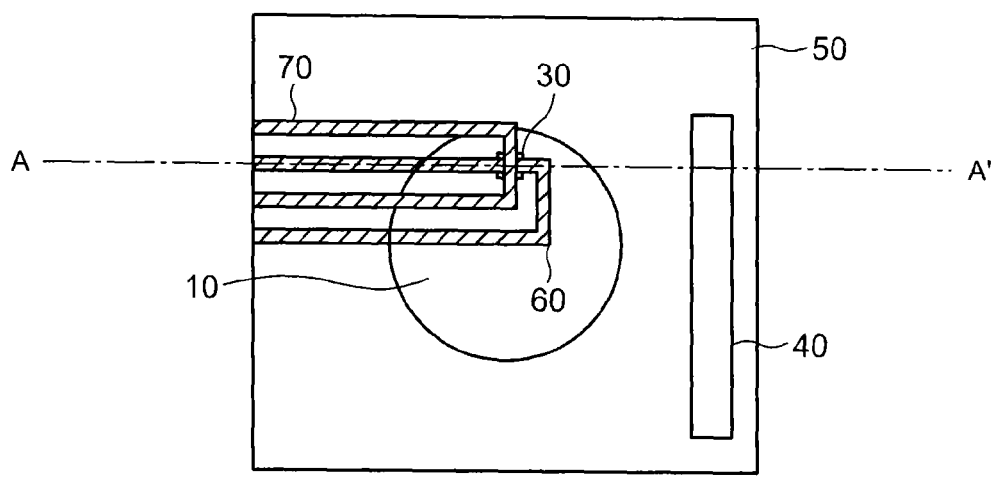
FIG. 2 is a view showing an embodiment of a pressure sensor device.

FIG. 1 shows a cross sectional view of a pressure sensor device 100. FIG. 2 shows a top view of the pressure sensor device 100. FIG. 1 corresponds to the A-A' cross sectional in FIG. 2.

The pressure sensor device 100 comprises a support substrate 20 including a thin film area 10 which is bent by pressure, a sensor film 30 provided on the thin film area 10, and a shield 40 comprised of a soft magnetic material. In this state, the thin film area 10 can be also defined as a first area, and an area on the support substrate 20 can be also defined as a second area. Insulating layers 45 can be provided so as to sandwich the sensor film 30 in a direction parallel to a film plane of the sensor film 30. Aluminum oxide ($Al_2O_3$) or silicon oxide ($SiO_2$) can be used for the insulating layer 45. A first electrode 60 and a second electrode 70 extended from the top and bottom of the insulating layers 45. The sensor film 30 is not provided in a center of the thin film area 10. This is because the pressure sensor 100 cannot detect pressure if the sensor film 30 is provided in the center of the thin film area 10.

The support substrate 20 includes a support part 50 and the thin film area 10. As shown in FIG. 2, the thin film area 10 is surrounded by the support part 50. The support part 50 is fixed and the thin film area 10 is bent when pressure is applied to the thin film area 10. In FIG. 1, a state is shown where the thin film area 10 is pressed from the underside of the thin film area 10 and the thin film area 10 is bent. When pressure is decreased, the thin film area 10 is bent to the underside. In the case where pressure is in an equivalent state (initial state), the thin film area 10 is not bent. The underside of the thin film refers to an area of the thin film area that the sensor film 30 is not provided.

Organic chemical material can be used for the thin film area 10. Polyimide or parylene can be used for the organic chemical material. These organic chemical materials have a high heat resistance. The reason for using these organic chemical materials is that a heat treatment can be done at about 250 degrees Celsius while applying a magnetic field to the sensor film 30 when fabricating the sensor film 30. Furthermore, these organic chemical materials can be easily bent. Si can be used for the support substrate 20. In this case, a material of the support part 50 is different from a material of the thin film area 10.

Also, the same material can be used for the support part 50 and the thin film area 10, and Si can be used as the same material. Thus, the thin film 10 can be bent if a thickness of the support part 50 is large and a thickness of the thin film area 10 is small. If the area of the thin film area 10 is larger, integration efficiency of the pressure sensor device 100, in the case where the pressure sensor device 100 is mounted on the thin film area 10, can be lower. For fabricating the non-breakable thin film area 10 and the pressure sensor device 100 with high integration efficiency, for example, a diameter of the thin film area 10 is 100 micro meters or more to 500 micro meters or less, and the thickness of the thin film area 10 is 0.1 micro meters or more to 1 micro meter or less when the shape of the thin film area 10 is a circle. Then, the thickness of the support part 50 is, for example, 10 micro meters or more so that the support part 50 is not bent. If the support part 50 were to bend, the thickness of the thin film area 10 is 100 micro meters or more.

The sensor film 30 comprises the first electrode 60, a reference layer 65 provided on the first electrode 60, a spacer layer 71 provided on the reference layer 65, a free layer 75 provided on the spacer layer 71, and the second electrode 70 provided on the free layer. The position of the free layer 75 and the reference layer 65 can be switched. A gap layer can be provided at least between the first electrode 60 and the thin film area 10, the top of the second electrode 70, or the side of the sensor film 30. The gap layer can make the first electrode 60, the second electrode 70, and the sensor film electrically insulated. Aluminum oxide, silicon oxide, or aluminum nitride can be used for the gap layer.

It is preferable that the shield 40 is easily penetrated by an external magnetic field. For this reason, a soft magnetic material whose coercivity is 50 Oersteds or less can be used for the shield 40. The coercivity of the shield 40 can be 10 Oersteds or less. The support part 50 is generally not bent when strain is applied to the support substrate 20. However, the shield 40 can be bent if a small strain is propagated to the support part 50. In this case, it is not preferable because magnetization of the shield 40 is changed and magnetic noise penetrates the free layer 75 of the sensor film 30. Thus, an absolute value of a magnetostrictive constant of the shield 40 is smaller than that of the free layer 75. NiFe alloy, NiFeX alloy (X is Cu, Cr, Ta, Rh, Pt, or Nb), CoZrNb alloy, or FeAlSi alloy can be used for the shield 40.

A material with low resistivity can be used for the first electrode 60 and the second electrode 70. An electrical resistance of the sensor film 30 is detected by use of the first electrode 60 and the second electrode 70. Current can be passed perpendicularly to the film plane of the sensor film 30. If the electrical resistance of the first electrode 60 and the second electrode 70 is low, parasitic resistance of the sensor film 30 can be suppressed. Cu, Au, or these related alloys can be used for the first electrode 60 and the second electrode 70.

In order to reduce the electrical resistance of the first electrode 60 and the second electrode 70, a thickness of the first electrode 60 and the second electrode 70 can be large. However, bending the thin film area 10 can be difficult if the thickness of the first electrode 60 and the second electrode 70 is too large. Thus, the thickness of the first electrode 60 and the second electrode 70 is 100 micro meters or more to 1000 micro meters or less.

NiFe, which is a soft magnetic material, can be used for the first electrode 60 and the second electrode 70. NiFe can cut off magnetic noise, and be used as an electrode. In this case, an absolute value of a magnetostrictive constant of the first electrode 60 and the second electrode 70, respectively, is smaller than that of the free layer 75. The electrical resistance of NiFe is about twice compared to Cu, Au, or these related alloys. For this reason, in the case where NiFe is used for the first electrode 60 and the second electrode 70, the thickness of the first electrode 60 and the second electrode 70 is about twice as thick as that of Cu, Au, or these related alloys.

In the case where the first electrode 60 and the second electrode 70 are disposed parallel to the film plane of the sensor film 30, current can be passed perpendicularly to the film plane of the sensor film 30. A four-terminal method using electrodes which detect the current and a voltage shift independently of each other, or a two-terminal method using an electrode which detects the current and the voltage shift can be used for the pressure sensor device 100.

The reference layer 65 can be used for referring magnetization of the free layer 75. Magnetization of the reference layer 65 is fixed in one direction. Also, the magnetization of the reference layer 65 can be in a variable state such as the magnetization of the free layer 75. This is because magnetoresistance can be detected if there is a relative angle between the magnetization of the reference layer 65 and the magnetization of the free layer 75. A material of the free layer 75 can be used for the reference layer 65. The material of the free layer 75 can be different from the material of the reference layer 65 because a high magnetostrictive constant for the reference layer 65 is not necessary. In the case where the material of the reference layer 65 is different from that of the free layer 75, FeCo alloy or CoFeB alloy or the like can be used for obtaining the high magnetoresistance rate.

Figure 3A:
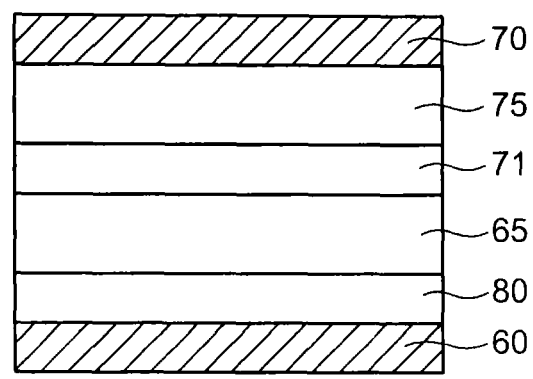
FIG. 3A is a view showing an embodiment of a pressure sensor device.
Figure 3B:
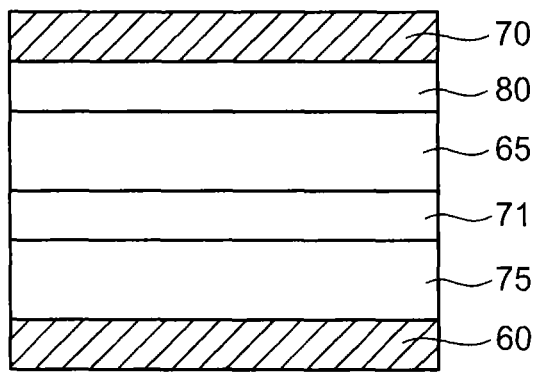
FIG. 3B is a view showing an embodiment of a pressure sensor device.

As shown in FIG. 3A, an antiferromagnetic layer 80 can be provided between the reference layer 65 and the first electrode 60. Providing the antiferromagnetic layer 80 enables stably fixing of the magnetization of the reference layer 60 by exchange-coupled energy of uniaxial magnetic anisotropy. IrMn alloy can be used for the antiferromagnetic layer 80. PtMn alloy or FeMn alloy can be also used for the antiferromagnetic layer 80. As shown in FIG. 3B, the second electrode 70 can be provided upside.

Figure 4A:
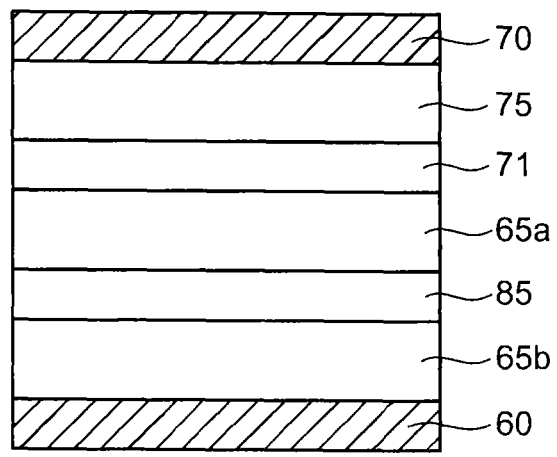
FIG. 4A is a view showing an embodiment of a pressure sensor device.
Figure 4B:
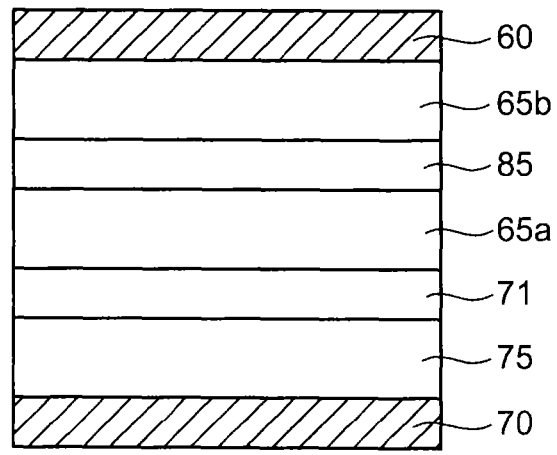
FIG. 4B is a view showing an embodiment of a pressure sensor device.

As shown in FIG. 4A, the reference layer 65 can be a synthetic structure. The synthetic structure is a structure where an antiparallel coupled layer 85 is provided between two reference layers 65a, 65b. Ru can be used for the antiparallel coupled layer 85. Rh, Ir can be used for the antiparallel coupled layer 85. A magnitude of magnetization of the reference layer 65 becomes small because the magnetization of the reference layer 65a and the magnetization of the reference layer 65b are coupled by an antiparallel state via the antiparallel coupled layer 85. For this reason, the magnetization of the reference layer 65 can be strongly fixed even if coupling energy from the antiferromagnetic layer 80 is constant. Thus, magnetic noise can be suppressed. The thickness of the antiferromagnetic layer 85 is, for example, 0.8 nano meters or more to 1.0 nano meter or less. As shown in FIG. 4B, the second electrode 70 can be provided underside.

The spacer layer 71 is comprised of a metal or insulating non magnetic material. In the case where the sensor film 30 is used by tunnel magnetoresistance (TMR), the spacer layer 71 is comprised of the insulating non magnetic material. For example, magnesium oxide (MgO), aluminum oxide ($Al_2O_3$), zinc oxide (ZnO), gallium oxide (GaO), titanium oxide (TiO), or aluminum magnesium oxide (MgAlO) can be used as the insulating non magnetic material. In this case, the thickness of the spacer layer 71 is 0.6 nano meters or more to 2.5 nano meters or less.

In the case where the sensor film 30 is used by giant magnetoresistance (GMR), the spacer layer 71 is comprised of metal. For example, Cu, Au, or Ag can be used as the metal. In this case, the thickness of the spacer layer 71 is 1 nano meter or more to 7 nano meters or less.

The magnetization of the free layer 75 is variable. An absolute value of a magnetostrictive constant of the free layer 75 is larger than that of the shield 40. The magnetization of the free layer 75 largely rotates by strain applied external to the thin film area 10 because a large absolute value of the magnetostrictive constant generates a large inverse magnetostriction effect. For this reason, output of the pressure sensor device 100 becomes large. For example, FeCo alloy, NiFe alloy can be used for the free layer 75. FeCoSiB alloy, TbMFe alloy (M is Sm, Eu, Gd, Dy, Ho, or Er) whose magnetostrictive value is larger than 100 ppm, TbM1FeM2 alloy (M1 is Sm, Eu, Gd, Dy, Ho, or Er, M2 is Ti, Cr, Mn, Co, Cu, Nb, Mo, W, or Ta), FeM3M4B alloy (M3 is Ti, Cr, Mn, Co, Cu, Nb, Mo, W, or Ta, M4 is Ce, Pr, Nd, Sm, Tb, Dy, or Er), Ni, AlFe, or ferrite ($Fe_3O_4$, $(FeCo)_3O_4$ or like), or the like can be used for the free layer 75. The thickness of the free layer 75 is, for example, 2 nano meters or more.

The free layer 75 can be a two layer structure. In this case, FeCo alloy which doesn't have a high MR (magnetoresistance) ratio, or CoFeB alloy is laminated on a spacer layer 71, then a material which is selected from FeCoSiB alloy, TbMFe alloy (M is Sm, Eu, Gd, Dy, Ho, or Er) whose magnetostrictive value is larger than 100 ppm, TbM1FeM2 alloy (M1 is Sm, Eu, Gd, Dy, Ho, or Er, M2 is Ti, Cr, Mn, Co, Cu, Nb, Mo, W, or Ta), FeM3M4B alloy (M3 is Ti, Cr, Mn, Co, Cu, Nb, Mo, W, or Ta, M4 is Ce, Pr, Nd, Sm, Tb, Dy, or Er), Ni, AlFe, or ferrite ($Fe_3O_4$, $(FeCo)_3O_4$ or like), or the like is further laminated.

Figure 5:
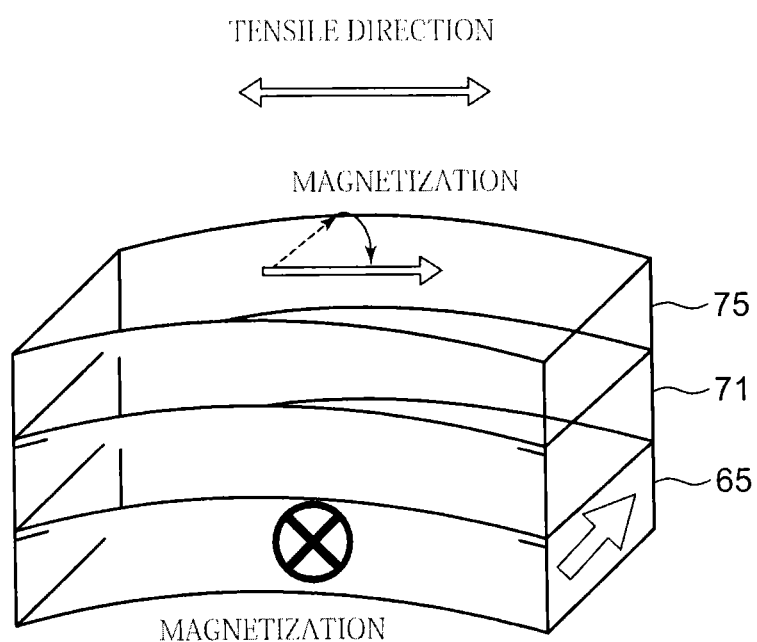
FIG. 5 is a view showing an embodiment of a pressure sensor device.

Operation of the pressure sensor device 100 will be explained with reference to FIG. 5.

When pressure is applied to the pressure sensor device 100, the thin film area 10 is bent, but the support part 50 is not bent because the support part 50 is fixed. When external pressure is applied to the pressure sensor device 100, the thin film area 10 is bent. When the thin film area 10 is bent, the magnetization of the free layer 75 rotates with the bending of the thin film area 10. Then, detecting the electrical resistance enables the pressure sensor device 100 to detect pressure because the electrical resistance is changed by the relative angle between the magnetization of the reference layer 65 and the magnetization of the free layer 75. This electrical resistance is output as an external signal, and then pressure is detected by a circuit, (not shown in the drawings) which is connected external to the pressure sensor device 100. In the case where the magnetostrictive constant is positive,
the magnetization of the free layer 75 rotates in a direction that the thin film area 10 is stretched (FIG. 5). In the case where the magnetostrictive constant is negative, the magnetization of the free layer 75 rotates in a direction that the thin film area 10 is compressed. This phenomena is knows as an inverse magnetostrictive effect.

Figure 6:
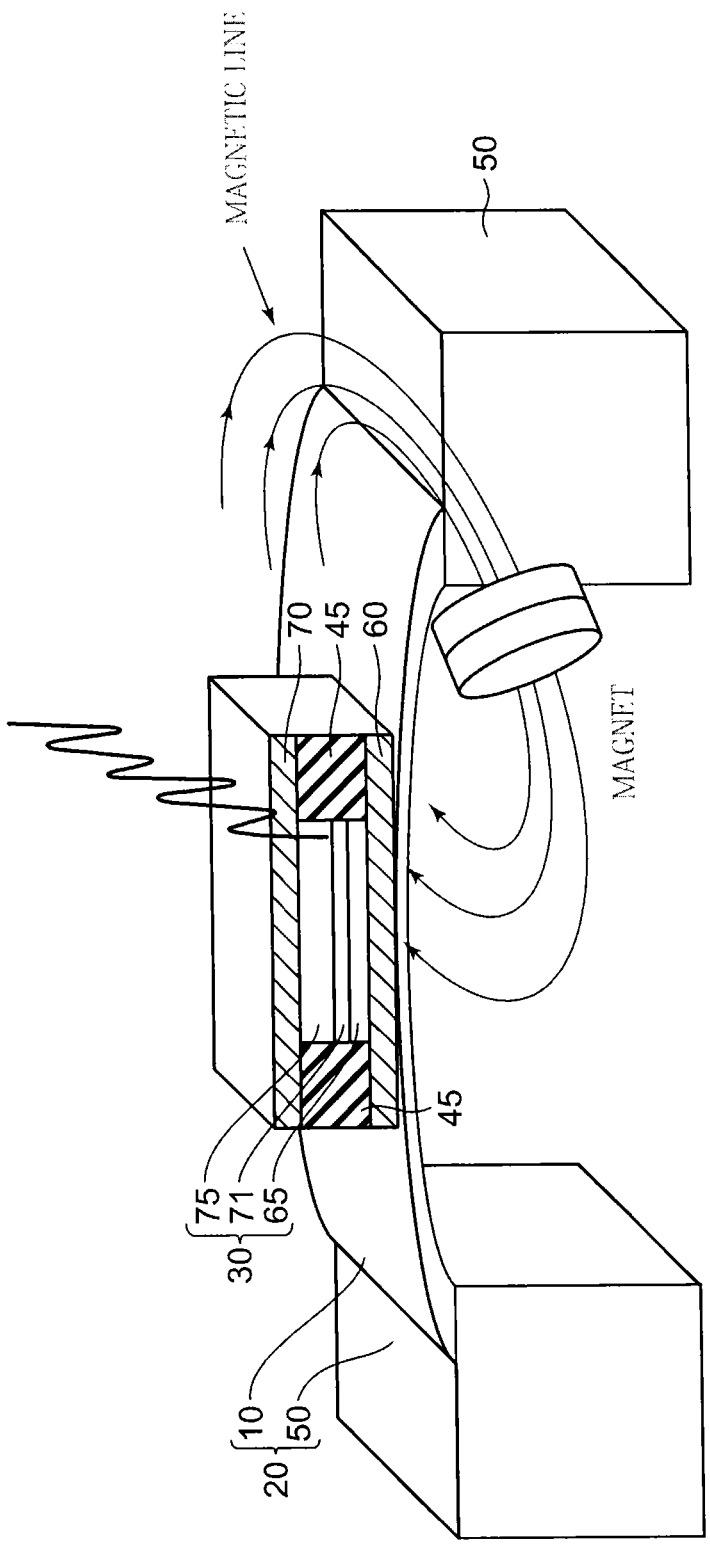
FIG. 6 is a view showing an embodiment of a pressure sensor device.

Ideally, pressure can be detected by the principle mentioned above. However, practically there is external magnetic noise. For this reason, in the pressure sensor device 100 the magnetization can be rotated by the magnetic noise. This state is shown in FIG. 6. As shown in FIG. 6, the magnetization of the free layer 75 rotates in a direction of a penetrating magnetic field corresponding to the magnetic noise. Thus, by the magnetic noise, the magnetization of the free layer 75 rotates. Then, the electrical resistance of the sensor film 30 is changed without pressure being applied to the pressure sensor device 100. If the effect of the magnetic noise is much larger, the free layer 75 itself becomes magnetic noise since the magnetization of the free layer 75 fluctuates.

In order to cut off the external magnetic noise, magnetic shield 40 is provided on a side of the pressure sensor device 100. Then, as shown in FIG. 7, the magnetic field of the magnetic noise is absorbed into the shield 40. Since the shield 40 can prevent the magnetic noise from penetrating into the free layer 75, the fluctuation of the magnetization of the free layer 75 becomes quite low and stable.

Here, the shield 40 is provided on the support part 50, not on the thin film area 10. This is because the magnetization of the shield 40 rotates by the bending of the thin film area 10 and new magnetic noise would be generated when the shield 40 is provided on the thin film area 10. Also, the sensitivity of the pressure sensor device 100 becomes low when the shield 40 is provided on the thin film area 10 because the thin film area 10 would be difficult to bend because of the thickness of the shield 40. Furthermore, the shield 40 would be bent with the bending of the thin film area 10 if the shield 40 were to be provided on the thin film area 10. Thus, the magnetic noise would be generated from the shield 40 because the magnetization of the shield 40 is fluctuated by the inverse magnetostrictive effect.

In the pressure sensor device 100, fluctuation of the magnetization of the shield 40 can be reduced by providing the shield 40 on the support part 50. The external magnetic noise can be cut off. For this reason, the pressure sensor device 100 is enabled to detect pressure. The pressure sensor device 100 can also work as a strain sensor device.

In order that the magnetization of the free layer 75 may rotate efficiently with the bending of the thin film area 10, it is preferable for the magnetization of the shield 40 to not turn in one direction. In other words, it is preferable for the whole of the magnetization of the shield 40 to be almost zero.

Fabrication of the pressure sensor device 100 will be explained herein below.

FIG. 8 to FIG. 12 shows a process of manufacturing the pressure sensor device 100.

Figure 8A:
FIG. 8A is a view showing a modified example of a pressure sensor device.

A material to be the first electrode 60 is deposited on the support substrate 20 by a sputtering method (FIG. 8A).

Figure 8B:
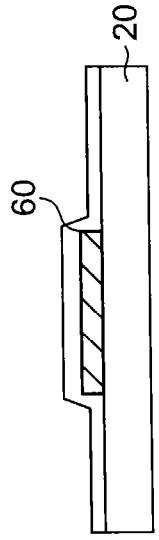
FIG. 8B is a view showing a modified example of a pressure sensor device.

A resist is applied on the material to be the first electrode 60. The resist is developed to leave a pattern of the first electrode 60. The area except for the developed area is removed (FIG. 8B).

Figure 8C:
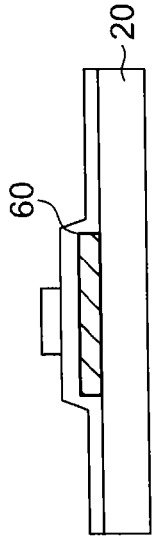
FIG. 8C is a view showing a modified example of a pressure sensor device.

The pattern of the first electrode 60 is formed by ion milling using the remaining resist as a mask (FIG. 8C).

Figure 8D:
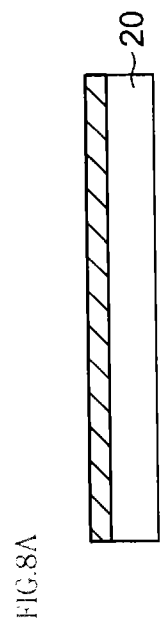
FIG. 8D is a view showing a modified example of a pressure sensor device.

The first electrode 60 is formed by removing the resist (FIG. 8D).

Figure 8E:
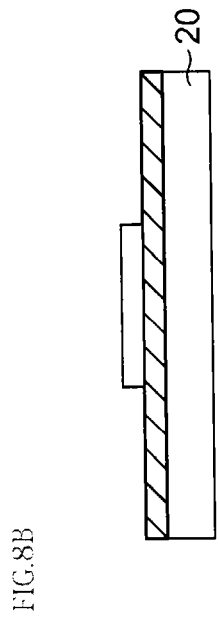
FIG. 8E is a view showing a modified example of a pressure sensor device.

A material to be the sensor film 30 is deposited on the first electrode 60 and the support substrate 20 by a sputtering method (FIG. 8E).

Figure 8F:
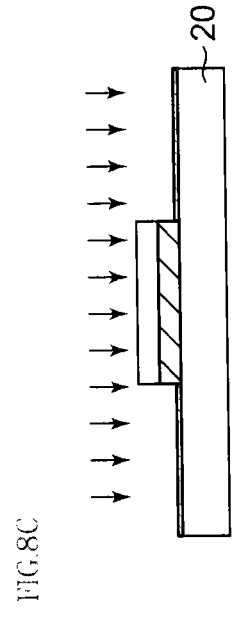
FIG. 8F is a view showing a modified example of a pressure sensor device.

A resist is applied on the material to be the sensor film 30. The resist is developed to leave a pattern of the sensor film 30. The area except for the developed area is removed (FIG. 8F).

Figure 9A:
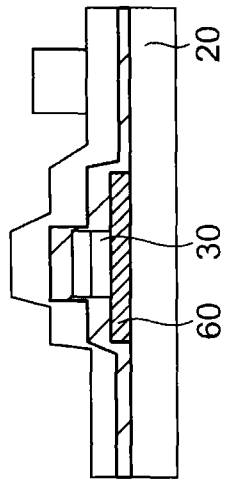
FIG. 9A is a view showing a modified example of a pressure sensor device.

The pattern of the sensor film 30 is formed by ion milling using the remaining resist as a mask (FIG. 9A).

Figure 9B:
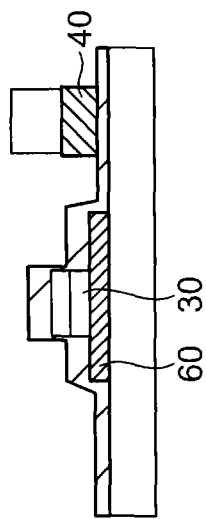
FIG. 9B is a view showing a modified example of a pressure sensor device.

An insulating layer to be the gap layer is deposited on the resist, the first electrode 60, and the support substrate 20 (FIG. 9B).

Figure 9C:
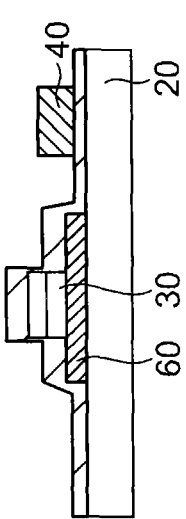
FIG. 9C is a view showing a modified example of a pressure sensor device.

A soft magnetic material layer to be the shield 40 is deposited on the gap layer by a sputtering method (FIG. 9C).

Figure 9D:
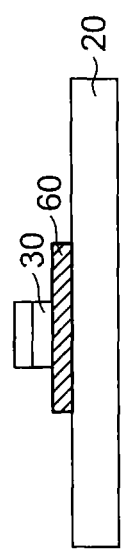
FIG. 9D is a view showing a modified example of a pressure sensor device.

A resist is applied on the soft magnetic layer to be the shield 40. The resist is developed to leave a pattern of the shield 40. The area except for the developed area is removed (FIG. 9D).

Figure 9E:
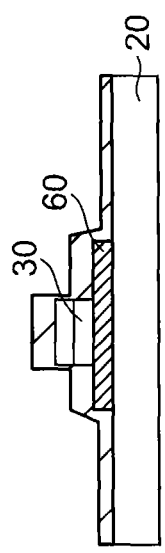
FIG. 9E is a view showing a modified example of a pressure sensor device.

The pattern of the shield 40 is formed by ion milling using the remaining resist as a mask (FIG. 9E).

Figure 9F:
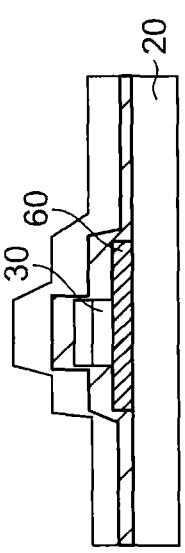
FIG. 9F is a view showing a modified example of a pressure sensor device.

The shield 40 is formed by removing the resist (FIG. 9F).

Figure 10D:
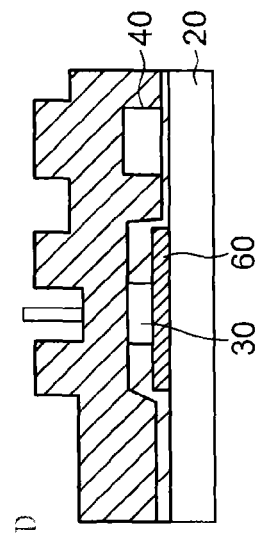
FIG. 10D is a view showing a modified example of a pressure sensor device.
Figure 10E:
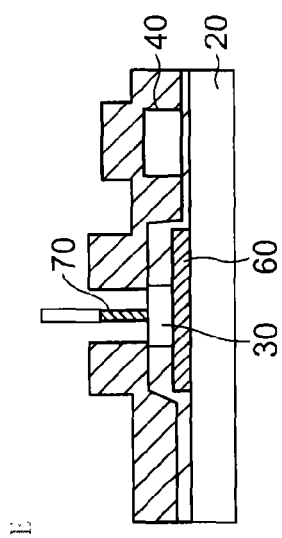
FIG. 10E is a view showing a modified example of a pressure sensor device.
Figure 10F:
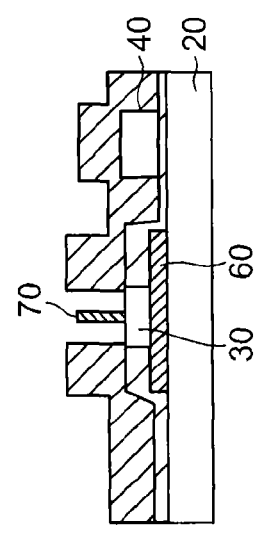
FIG. 10F is a view showing a modified example of a pressure sensor device.
Figure 10A:
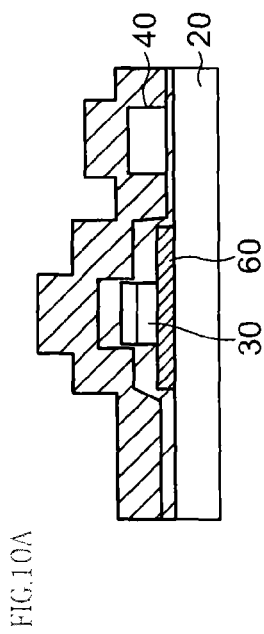
FIG. 10A is a view showing a modified example of a pressure sensor device.

An insulating layer to be the gap layer is deposited on the shield 40 and the insulating layer which is already deposited (FIG. 10A).

Figure 10B:
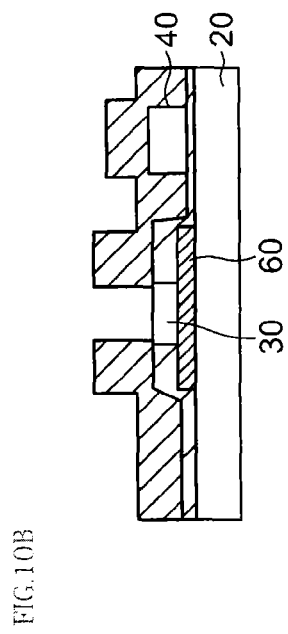
FIG. 10B is a view showing a modified example of a pressure sensor device.

The top surface of the sensor film 30 is uncovered by liftoff (FIG. 10B).

Figure 10C:
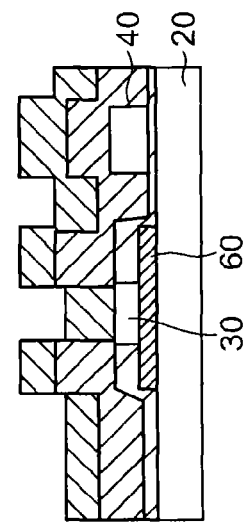
FIG. 10C is a view showing a modified example of a pressure sensor device.

A material to be the second electrode 70 is deposited on the insulating layer and the sensor film 30 by a sputtering method (FIG. 10C).

A resist is applied on the material to be the second electrode 70. The resist is developed to leave a pattern of the second electrode 70. The area except for the developed area is removed (FIG. 10D).

The pattern of the second electrode 70 is formed by ion milling using the remaining resist as mask (FIG. 10E).

The second electrode 70 is formed by removing the resist (FIG. 10F).

A resist is applied on the reverse side of the support substrate 20 (FIG. 11A).

The resist except for an area to be the thin film area 10 is left by developing the reverse side (FIG. 11B).

RIE (Reactive Ion Etching) is performed to the support substrate 20 from the reverse side, and the support substrate 20 is etched (FIG. 11C).

The pressure sensor device 100 is fabricated by removing the resist (FIG. 11D).

Figure 12:
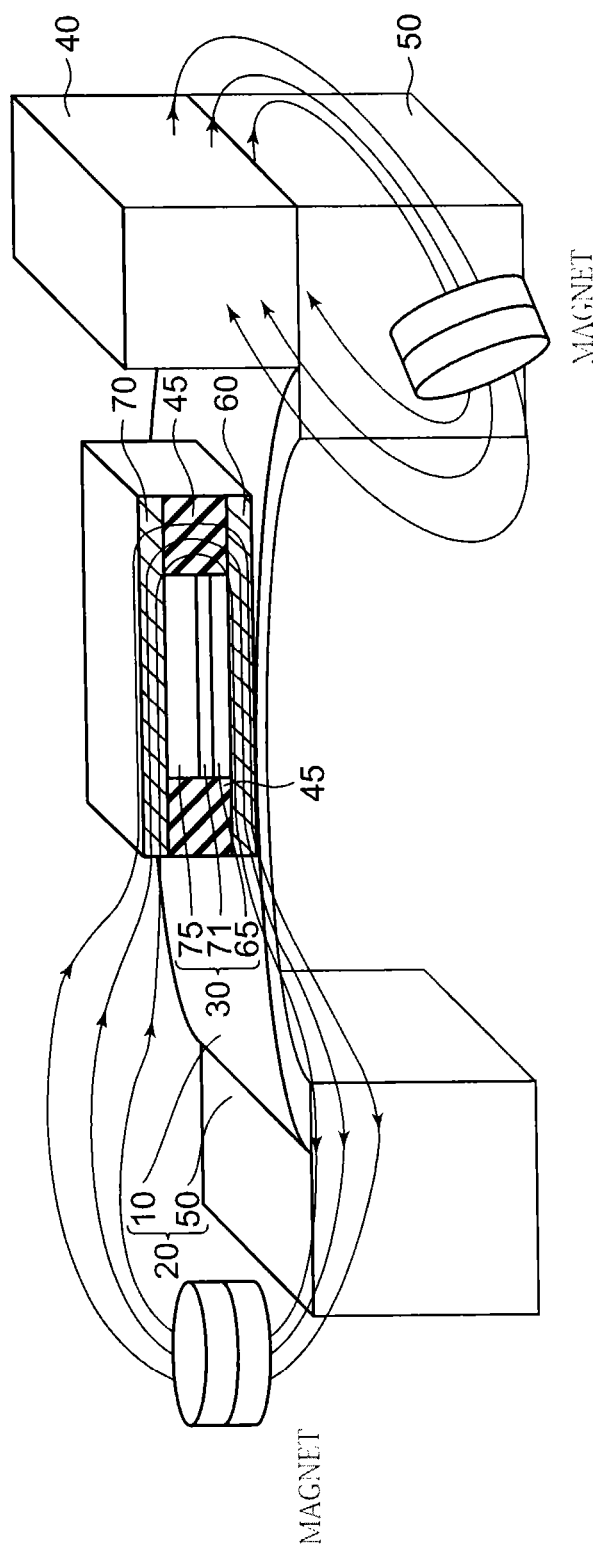
FIG. 12 is a view showing a modified example of a pressure sensor device.

FIG. 12 shows a case where a soft magnetic material is used for the first electrode 60 and the second electrode 70. In this case, the function of the first electrode 60 and the second electrode 70 is same as the function of the shield 40. Thus, the magnetic noise is diminished further. For example, NiFe alloy, NiFeX alloy (X is Cu, Cr, Ta, Rh, Pt, or Nb), CoZrNb alloy, or FeAlSi alloy can be used for the first electrode 60 and the second electrode 70.

Figure 13:
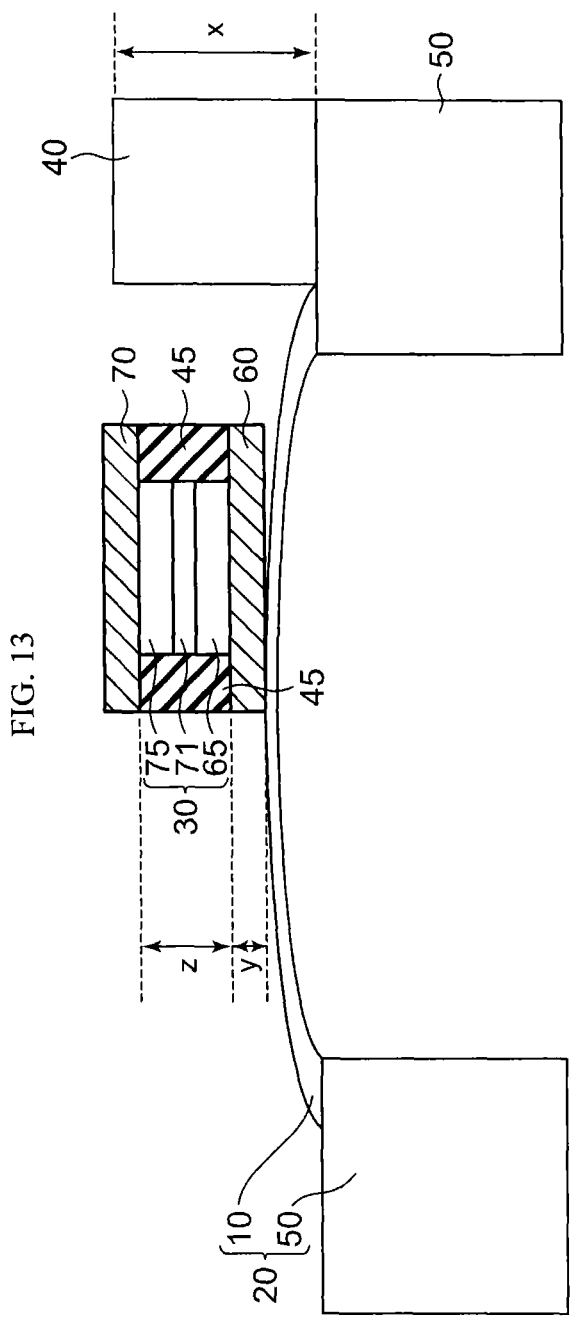
FIG. 13 is a view showing a modified example of a pressure sensor device.

FIG. 13 shows the position of the shield 40 and the pressure sensor device 100. In order to cut off the magnetic noise efficiently, it is preferable that the sensor film 30 is spatially provided between the top of the shied 40 and the bottom of shield 40. For example, if the thickness of the shield 40 is x, the thickness of the first electrode 60 is y, and the thickness of the sensor film 30 is z, the pressure sensor device 100 has relation that x is larger than z plus y ($x > z + y$). Furthermore, it is preferable that the thickness of the shield 40 is larger than the distance from the top of the sensor film 30 to the top of the support substrate 20 when the thin film area 10 is bent. That is, the free layer 75 is in an area from the top of the support substrate 20 to the top of the shield 40.

Figure 14:
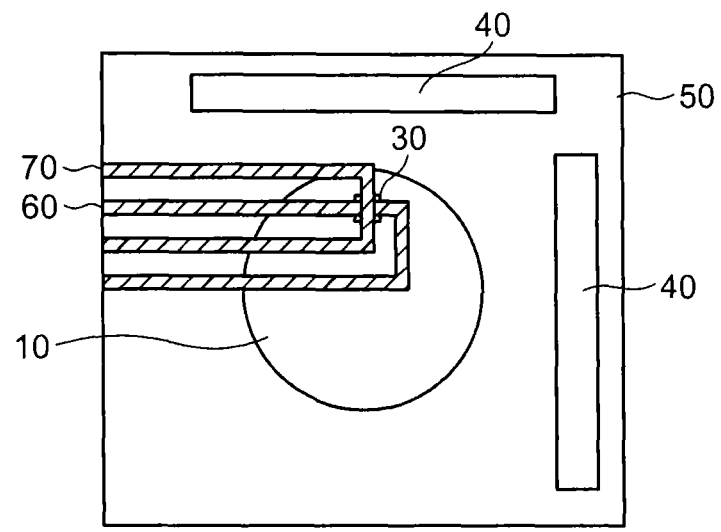
FIG. 14 is a view showing a modified example of a pressure sensor device.
Figure 15:
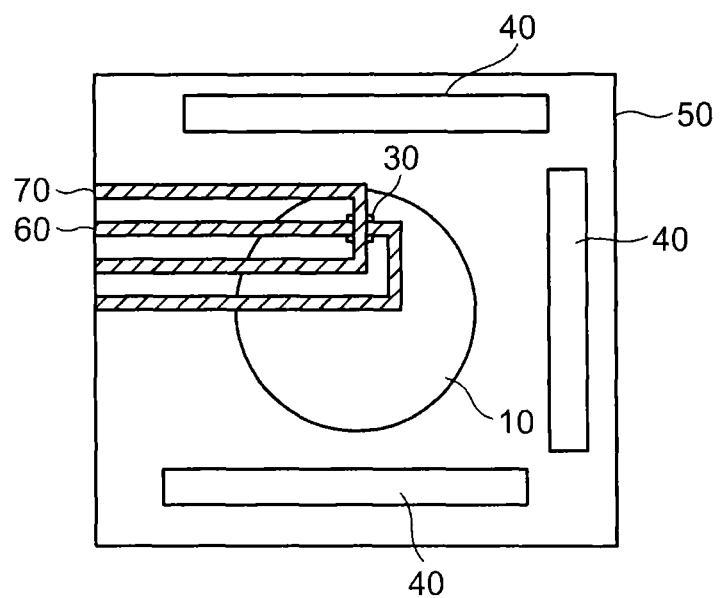
FIG. 15 is a view showing a modified example of a pressure sensor device.

FIG. 14 shows a top view of the pressure sensor device 100. As shown in FIG. 14, two shields 40 are provided on the support part 50. The shields 40 are provided separately from each other to make a space such that the magnetic field of the magnetic noise can escape outward. In FIG. 14, two rectangle shields 40 in a corner are provided on the support part 50. That is, the shields 40 may be provided on the support part 50 so as to surround the thin film area 10. Thus, two or more shields 40 can be provided on the support part 50. Three shields 40 can be provided on the support part 50 as shown in FIG. 15.

Figure 16A:
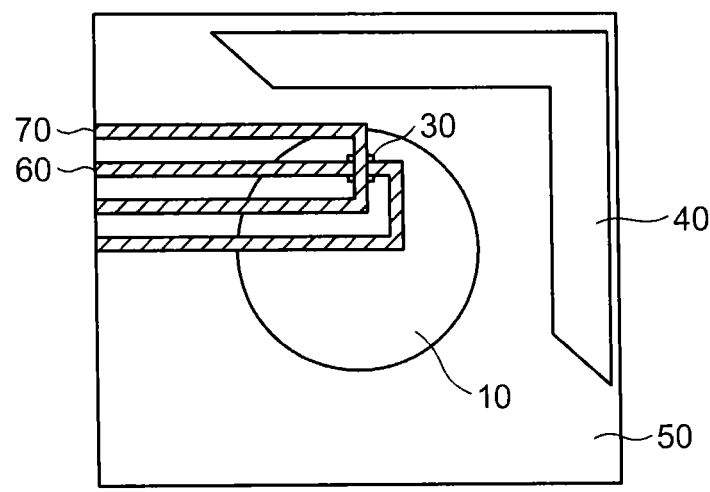
FIG. 16A is a view showing a modified example of a pressure sensor device.
Figure 16B:
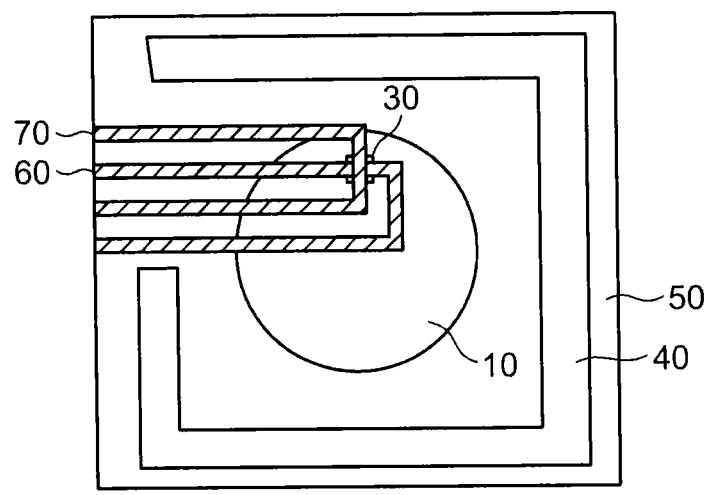
FIG. 16B is a view showing a modified example of a pressure sensor device.

FIG. 16 is a top view of the pressure sensor 100. In FIG. 16A, a polygon shape shield 40 is provided on the support part 50. As shown in FIG. 16B, the shape of the shield 40 can be such that a portion of the shield 40 is separated and surrounds the thin film area 10.

Figure 17:
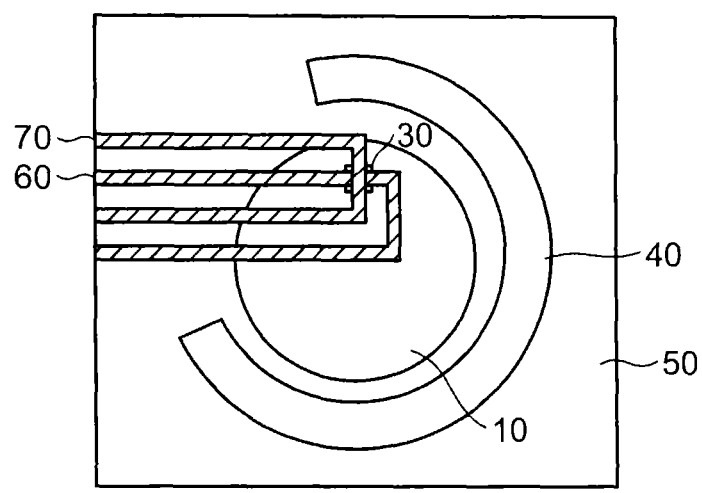
FIG. 17 is a view showing a modified example of a pressure sensor device.
Figure 18:
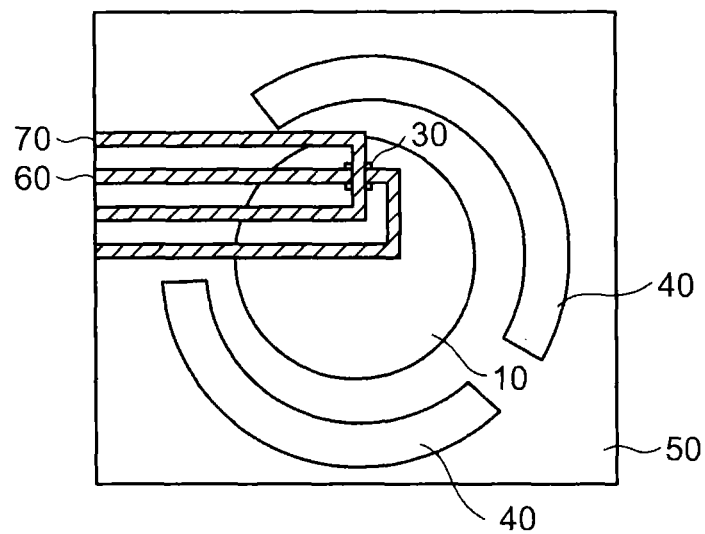
FIG. 18 is a view showing a modified example of a pressure sensor device.

FIG. 17 is a top view of the pressure sensor 100. In FIG. 17, a portion of the shield 40 is separated and the shape of the shield 40 is a circular arc. As shown in FIG. 18, the number of shields 40 can be two and each can be separated.

Figure 19:
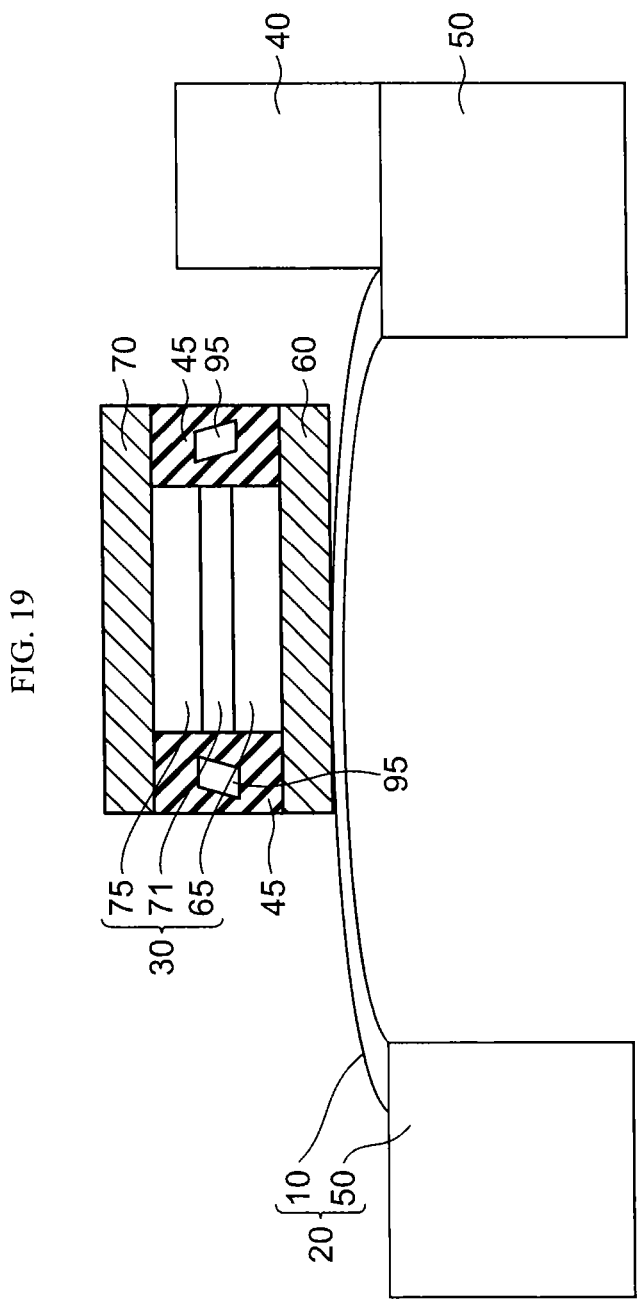
FIG. 19 is a view showing a modified example of a pressure sensor device.

FIG. 19 shows a hard bias 95 embedded in the insulating layer 45. The output of the pressure sensor device 100 increases when the magnetization of the free layer 75 is in a single domain by virtue of the hard bias because the output is not stabilized due to rotating of all magnetization of the free layer 75. In the case where strain is not applied to the thin film area 10 and the hard bias 95 is not embedded in the insulating layer 45, the magnetization of the free layer 75 has various orientations. Thus, the magnetization of the free layer 75 splits into plural domains. In that state, the rotation of the magnetization in some domains becomes large, but the magnetization of other domains does not almost rotate when the magnetization of the free layer 75 rotates in a direction that tensile strain is applied. For this reason, the output of the pressure sensor device 100 decreases because on average of a relative angle between the magnetization of the free layer 75 and the magnetization of the reference layer 60 become small. On the other hand, the output of pressure sensor device 100 increases if the magnetization of the free layer 75 is in the single domain such that the whole magnetization is in one direction by way of the hard bias 75, because the whole magnetization of the free layer 75 rotates in a direction that the tensile strain is applied. For example, CoPt alloy or CoPt alloy can be used for the hard bias 95.

Confirmation of the decreasing of the magnetic noise by fabricating the pressure sensor device 100 is explained below.

A circular shape Si substrate was used for the support substrate 20 whose diameter was 300 micro meters and thickness was 500 micro meters. The support part 50 had a thickness of 500 micro meters. The thin film area 10 was formed by etching a part of the Si substrate thinly. The thickness of the thin film area 10 was 0.2 micro meters. Cu (300 nano meters thickness) was used for the first electrode 60, Cu (200 nano meters thickness)/Au (100 nano meters thickness) was used for the second electrode 70. The thickness is described in the parenthesis. For the sensor film 30, from the substrate 20, Ta (1 nano meter)/Ru (2 nano meters)/IrMn (7 nano meters)/CoFe (2.5 nano meters)/Ru (0.8 nano meters)/CoFeB (3 nano meters, corresponding to the reference layer 65)/MgO (1 nano meter, corresponding to the space layer 71)/CoFeB (4 nano meters, corresponding to the free layer 75)/Cu (1 nano meter, corresponding to a cap layer)/Ta (3 nano meters, corresponding to the cap layer)/Ru (15 nano meters, corresponding to the cap layer) was used. Here, CoFeB being a low magnetostrictive material, not a high magnetostrictive material, was used because this experiment was performed for verifying the effect of the shield 40. The sensor film 30 was manufactured into a square being 500 by 500 micro meters, and the insulating layer 45, comprised of silicon oxide, was embedded around the sensor film 30.

Figure 20:
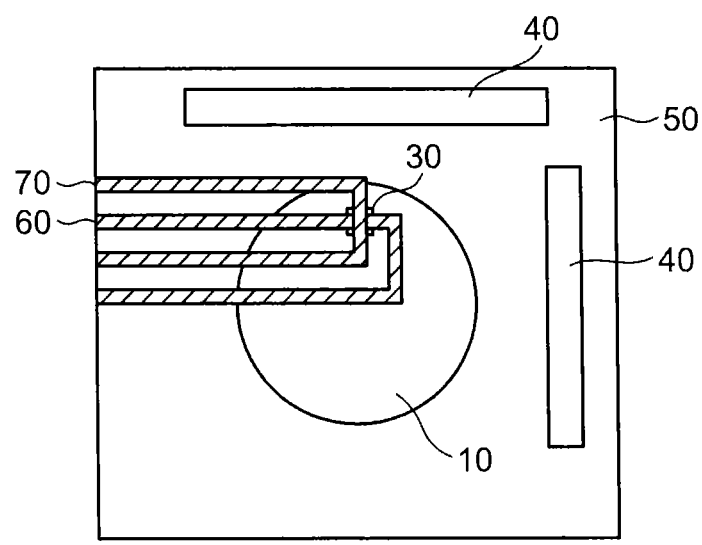
FIG. 20 is a view showing a modified example of a pressure sensor device.

Three rectangle shields, the long side being 400 micro meters and short side being 50 micro meters, were used for the shield 40. This state is shown in FIG. 20. These three shields 40 were provided on the support part 50 so as to surround the sensor film 30. The thickness of the shield 40 was 500 micro meters. Furthermore, the pressure sensor device 100 was mounted and the electrodes equipped with the pressure sensor device 100 were uncovered with the pressure sensor device 100.

Figure 21A:
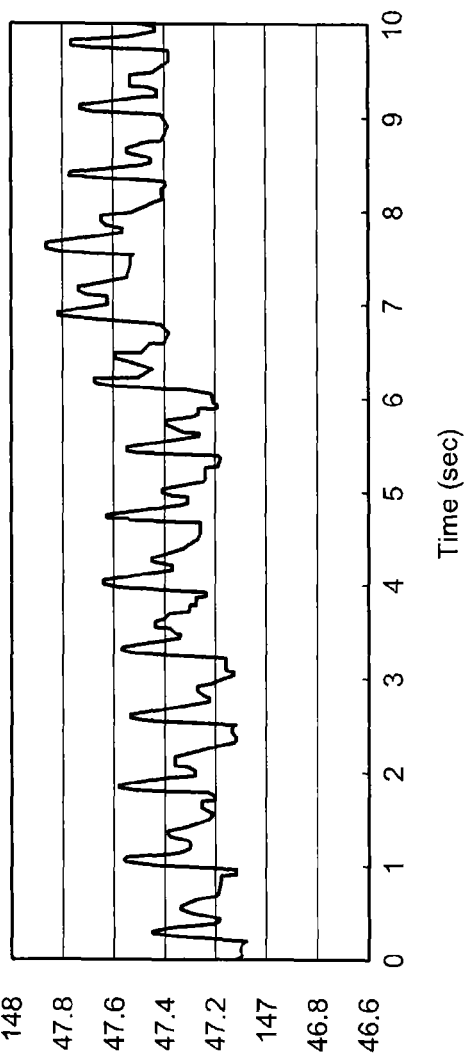
FIG. 21A is a view showing a result of a pressure sensor device in use.

FIG. 21A shows a result of detecting the blood pressure of a human being by using the pressure sensor device 100. A horizontal axis is time (sec) and a vertical axis is pressure (arbitrary unit). The pressure sensor 100 was attached on a wrist radius and the blood pressure was detected by using the pressure sensor device 100. From FIG. 21, the results of pressure sensor device 100 detecting blood pressure fluctuation with heart rate, and also second shock by reflection, is shown. Each peak shape of the blood pressure derived from the pulse waves was different. It is important to precisely detect the peak shape of the blood pressure because a cardiovascular disorder may be diagnosed fast by analyzing the peak shape of the blood pressure. The method of directly detecting the blood flow by injecting the needle into a blood vessel is known. However, it is difficult to use this method to detect the blood pressure daily and to use it for a health check because this method is a burden for patients. Using pressure sensor device 100 enables the precise detection of blood pressure corresponding to the blood flow.

Figure 21B:
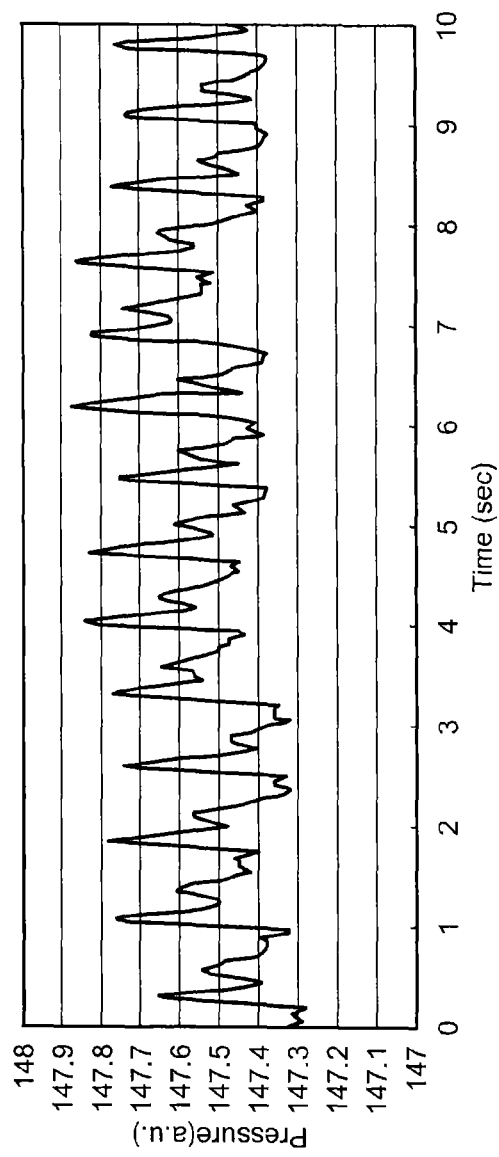
FIG. 21B is a view showing a result of a pressure sensor device in use.

However, in the case of using the pressure sensor device 100 in a daily life, as shown in FIG. 21B, the peak shape of the blood pressure was changed due to disruption of the data when the external magnetic noise penetrated into the pressure sensor device without the shield 40. In order to detect more precisely, the shield 40 is needed for the pressure sensor device 100 in order to prevent changes the peak shape of the blood pressure due to the external magnetic noise.

The installation place can be important for the shield 40. This is because it is difficult to obtain a high sensitive pressure sensor device unless the external pressure is propagated to the thin film area 10 efficiently. In order to bend the free layer 75 in the sensor film 30 sensitively toward the external pressure, the pressure sensor device 100 will precisely detect pressure if the thin film area 10 equipped with the sensor film 30 directly receives the external pressure as much as possible. However, propagation efficiency of pressure can be decreased if a hard magnetic shield exists between the thin film area 10 and the direction applying pressure. A configuration surrounding a support substrate from whole direction has been proposed, but in this case it is not good for the high sensitive pressure sensor device because the directions of propagating pressure can be extremely decreased. For this reason, the shield 40 is provided on the side of the support substrate 20 that sensor film 30 is equipped in order not to decrease the directions of propagating pressure. This alignment is also good for fabrication of the pressure sensor device 100 because the shield 40 can be fabricated in a fabrication process of the sensor film 30, the first electrode 60, and the second electrode 70.

Furthermore, the shield 40 works well in the case where the shield 40 is provided on the support part 50 and not on the thin film area 10 that can be bent. This is because, on the thin film area 10, the shied 40 can be bent simultaneously with the sensor film 30 and the shield 40 generates the magnetic noise.

An example has been explained by detecting blood pressure, but sensor device sensitivity is also demanded for whole sensors which detect pressure, such as an acceleration sensor, a phonetic microphone, and an ultrasonic wave sensor or the like. The pressure sensor device 100 achieves compact size and high sensitivity by providing the magnetic shield 40 on the support substrate 20, especially on the support part 50, mounting the sensor film 30.

As mentioned above, the pressure sensor device 100 can be applied to the acceleration sensor, the phonetic microphone, and the ultrasonic wave sensor or like.

While certain embodiments of the embodiment of the invention have been described, these embodiments have been presented by way of example only, and are not intended to limit the scope of the embodiments of the invention. Indeed, the novel elements and apparatuses described herein may be embodied in a variety of other forms; furthermore, various omissions, substitutions and changes in the form of the methods and systems described herein may be made without departing from the spirit of the embodiment of the invention. The accompanying claims and their equivalents are intended to cover such forms or modifications as would fall within the scope and spirit of the embodiment of the invention.

What is claimed is:

1. A pressure sensor device comprising:
   a thin film bendable by a pressure;
   a support which fixes the thin film and has a thickness larger than a thickness of the thin film;
   a sensor on the thin film, the sensor comprising:
      a first electrode on the thin film,
      a second electrode,
      a reference layer between the first electrode and the second electrode,
      a free layer between the reference layer and the first electrode or between the reference layer and the second electrode, and a spacer layer between the reference layer and the free layer, wherein the magnetization of the free layer is changeable when the thin film is bent; and a shield on the support, the shield comprising a soft magnetic material, wherein the sensor is arranged between a first part of the shield and a second part of the shield in a first direction, the first direction extending along a wider surface of the thin film, and wherein the soft magnetic material of the shield is formed entirely outside the thin film such that the soft magnetic material of the shield does not overlap the thin film in a direction perpendicular to the wider surface of the thin film.

2. The device of claim 1, wherein a material of the thin film is different from a material of the support.

3. The device of claim 1, wherein the first electrode and the second electrode comprise a soft magnetic material.

4. The device of claim 1, wherein an absolute value of a magnetostrictive constant of the free layer is larger than an absolute value of a magnetostrictive constant of each of the shield, the first electrode, and the second electrode.

5. The device of claim 1, wherein the shield comprises NiFe alloy, NiFeX alloy (X is Cu, Cr, Ta, Rh, Pt, or Nb), CoZrNb alloy, or FeAlSi alloy.

6. The device of claim 1, wherein a thickness of the shield is greater than a distance from a top of the sensor, when the thin film is bent, to a top of the support.

7. The device of claim 1, wherein the free layer exists in a range from a top of the support to a top of the shield.

8. The device of claim 1, further comprising a pair of hard biases on the thin film, sandwiching the sensor.

9. The device of claim 1, further comprising an antiferromagnetic layer between the reference layer and the first electrode.

10. The device of claim 1, further comprising an antiferromagnetic layer between the reference layer and the second electrode.

11. The device of claim 1, wherein the reference layer is formed of a first reference and a second reference layer.

12. The device of claim 11, further comprising an antiparallel coupled layer between the first reference layer and the second reference layer.

13. The device of claim 1, wherein the sensor and a third part of the shield are arranged along a second direction, the second direction having a direction which is perpendicular to the first direction, the second direction extending along the wider surface of the thin film.

14. The device of claim 1, wherein the first part of the shield and the second part of the shield are separated.

15. The device of claim 14, wherein the sensor and a third part of the shield are arranged along a second direction, the second direction having a direction which is perpendicular to the first direction, the second direction extending along the wider surface of the thin film.

16. The device of claim 15, wherein
the first part of the shield and the third part of the shield are separated, and
the second part of the shield and the third part of the shield are separated.

17. A pressure sensor comprising:
a thin film bendable by a pressure;
a support which fixes the thin film and has a thickness larger than a thickness of the thin film;
a sensor on the thin film, the sensor comprising:
 a first electrode on the thin film,
 a second electrode,
 a reference layer between the first electrode and the second electrode,
 a free layer between the reference layer and the first electrode or between the reference layer and the second electrode, and
 a spacer layer between the reference layer and the free layer,
 wherein the magnetization of the free layer is changeable when the thin film is bent; and
a shield on the support, the shield comprising a soft magnetic material, wherein
the sensor and a first part of the shield are arranged along a first direction, the first direction extending along a wider surface of the thin film,
the sensor and a second part of the shield are arranged along a second direction, the second direction having a direction which is perpendicular to the first direction, the second direction extending along the wider surface of the thin film, and the soft magnetic material of the shield is formed entirely outside the thin film such that the soft magnetic material of the shield does not overlap the thin film in a direction perpendicular to the wider surface of the thin film.

18. The pressure sensor of claim 17, wherein the first part of the shield and the second part of the shield are separated.

* * * * *